United States Patent

Maloney et al.

[11] Patent Number: 5,889,783
[45] Date of Patent: Mar. 30, 1999

[54] DATA COMMUNICATION

[75] Inventors: Brian G. Maloney; Paul S. Marston, both of Cambridge, England

[73] Assignee: U.S. Philips Corporation, New York, N.Y.

[21] Appl. No.: 541,383

[22] Filed: Oct. 10, 1995

[30] Foreign Application Priority Data

Oct. 26, 1994 [GB] United Kingdom .................... 9421552

[51] Int. Cl.⁶ .................................................... G06F 11/00
[52] U.S. Cl. ................................................................ 371/2.1
[58] Field of Search ....................... 371/2.1; 340/825.52; 375/56

[56] References Cited

U.S. PATENT DOCUMENTS

| | | | |
|---|---|---|---|
| 4,376,279 | 3/1983 | Perlman et al. | 235/380 |
| 4,427,980 | 1/1984 | Fennell et al. | 340/825.52 |
| 5,313,493 | 5/1994 | Dutta | 375/56 |
| 5,640,455 | 6/1997 | Shimada | 380/42 |

FOREIGN PATENT DOCUMENTS

0577323 A1  1/1994  European Pat. Off. ........ H04L 27/12
WO9501708  1/1995  WIPO ............................ H04Q 11/04

OTHER PUBLICATIONS

European Telecommunication Standard: Final Draft prETS 300, 133–3, Paging System; European Radio Message System (ERMES) Pt. 4: Air interface spec. Sections 5.2.3 (p. 13); 5.4 (pp. 13 & 14) and 8 (pp. 23 & 24) Oct. 1991.

*Primary Examiner*—Phung M. Chung
*Attorney, Agent, or Firm*—Jack D. Slobod

[57] ABSTRACT

A method of, and system for, communicating s-bit symbols using an M-ary modulation scheme in which a plurality of code words are arranged as rows of a block which is read-out orthogonally to the rows. In order to increase the dependability of the recovered code words, when the code words are stored or read-out the order of the bits forming some of the s-bit symbols is transformed so that those which would have been least significant bits (LSBs) are most significant bits (MSBs) and vice versa, the MSBs being affected less by noise than the LSBs when transmitted. At the receiver those s-bit symbols which have been transformed are restored to their original order.

9 Claims, 2 Drawing Sheets

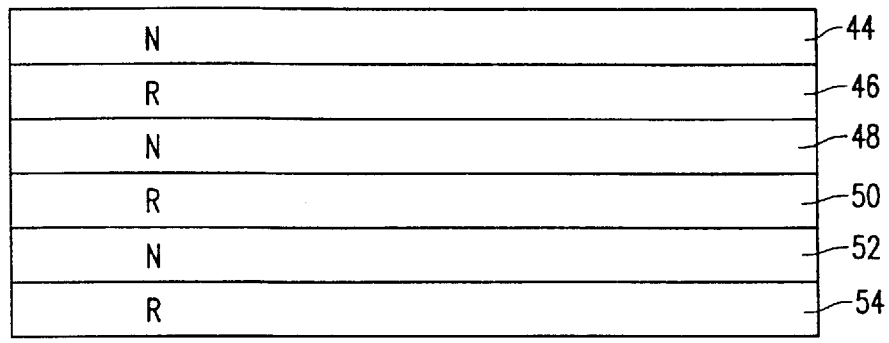
FIG. 4
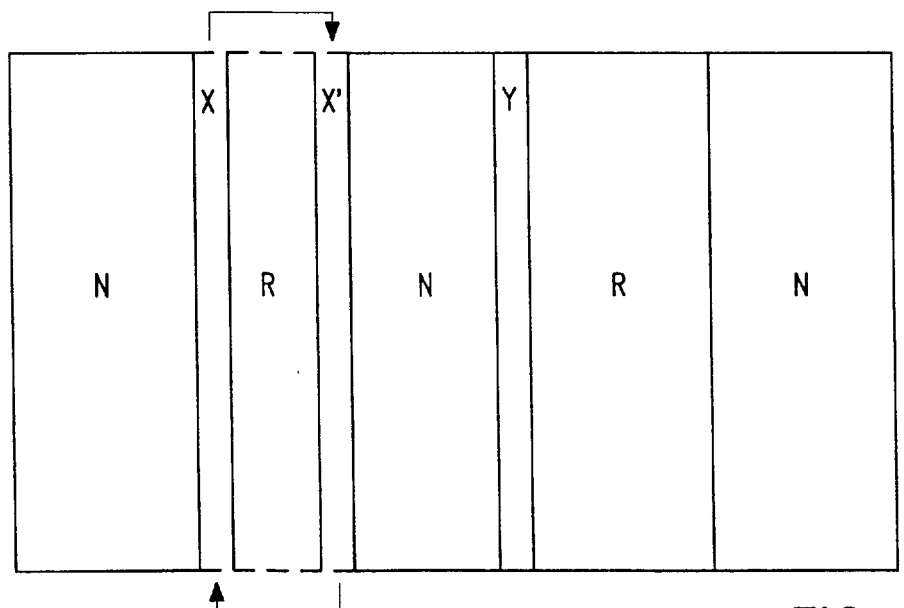
FIG. 5
FIG. 6

DATA COMMUNICATION

BACKGROUND OF THE INVENTION

The present invention relates to improvements in or relating to data communication and particularly, but not exclusively, to improved protection for interleaved block codes such as are used in transmitting data messages, for example paging messages transmitted at various bit rates such as 2400, 3200 and 6400 bits per second.

Typically at the lower bit rates two level FM modulation, that is M=2, is contemplated but at the higher bit rates four level FM (Gray Coded) modulation, that is M=4, is contemplated. There is a relationship between the number, s, of bits in a symbol and the number, M, of modulation levels, namely $M=2^s$. Taking four level FM Gray Coded modulation as an example, data is transmitted as 2 bit symbols and the symbols are transmitted as the symbol most significant bit (MSB) together with the symbol least significant bit (LSB). A problem which occurs in this mode of modulation is that the LSB is more susceptible to noise than the MSB because over the deviation range the MSB undergoes one transition whilst the LSB undergoes two transitions.

As is known, paging codes such as POCSAG and others are capable of limited error correction and in order to counter the effects of burst errors, block interleaving is utilised. As an example, 16 successive code words are arranged row by row to form a block and are transmitted column by column, beginning with the first bits of the first, second and third code words and so on until the first bit of the sixteenth code word, then continuing with the second bit of the first code word and so on until the last bit of the 16th code word. Using Gray Coded modulation schemes, the even numbered bits as transmitted are more susceptible to noise than the odd numbered bits. The practical effect of this is that at the receiver when the blocks of 16 code words are reconfigured, the odd numbered code words are more dependable than the even numbered code words.

The ERMES paging code published by ETSI, the European Telecommunications Standards Institute, contemplates a single bit rate. Block interleaving is used but each block comprises an odd number of code words, namely 9 code words. A practical effect of this is that, when transmitting data symbols are read out as before, but because of there being an odd number of code words in the block, when reading out the even numbered columns the odd numbered bits are inherently more susceptible to noise than the even numbered bits. Consequently, when the blocks of code words are re-established at a receiver each code word comprises bits which are more dependable interleaved with bits which are less dependable.

Higher rate paging protocols now being considered require a basic framing structure in which batches or blocks are of constant duration which means that if the bit rate is doubled then double the number of code words comprise the interleaved block structure. The improved bit protection provided by ERMES would under such circumstances not be possible because each interleaved block would comprise an even number of code words if the bit rate was doubled or quadrupled and as a result the transmission of symbols would result in alternate reconstituted code words being of greater and less dependability.

SUMMARY AND OBJECTS OF THE INVENTION

An object of the present invention is to improve the protection for interleaved block codes which are transmitted at different bit rates.

According to one aspect of the present invention there is provided a communications system comprising a transmitter and a receiver, the transmitter having means for accepting data, means for formatting the data into code words, means for assembling concatenated code words into blocks, means for transforming the order of at least some of the bits, and M-ary modulation means, where M equals at least 4, and the receiver comprising means for receiving the transmitted signal, demodulation means, means for restoring the order of those bits which were transformed and for storing successive symbols in columns of a block and means for reading out rows of bits as code words for decoding.

According to a second aspect of the present invention there is provided a method of communicating data, comprising formatting data for transmission into code words, assembling the code words into blocks in which each row is constituted by a code word, transforming the order of at least some of the bits so that when read out column by column, bits which have otherwise been LSBs are MSBs and vice versa, modulating the bits using a M-ary modulation scheme, where M is an integer equal to at least 4, transmitting the modulated signal, receiving the transmitted signal, demodulating the received signal, storing successive symbols in columns of a block, restoring the order of those bits which were transformed, and decoding rows of bits which are read out as code words.

The present invention also relates to a transmitter and to a receiver for operating in the system made in accordance with the first aspect of the present invention.

BRIEF DESCRIPTION OF THE DRAWINGS

The present invention will now be described, by way of example, with reference to the accompanying drawings, wherein:

FIGS. 2 to 6 are diagrams illustrating a number of transformation schemes.

DESCRIPTION OF THE PREFERRED EMBODIMENTS

Figure 1:
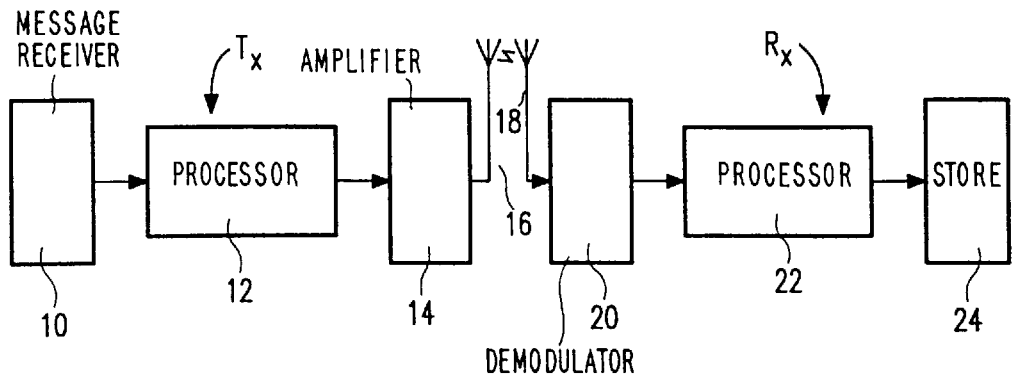
FIG. 1 is a block schematic diagram of a communications system comprising a transmitter and a receiver.

The present invention will be described in the context of a 4-level FM, Gray Coded, signal where the 2 bit symbols, referred to as di-bit symbols, are transmitted as follows:

MSB/LSB

"00" carrier frequency+4800 Hz

"01" carrier frequency+1600 Hz

"11" carrier frequency−1600 Hz

"10" carrier frequency−4800 Hz

When transmitting signals the binary order conversion is the symbol MSB followed by symbol LSB.

In order to provide a greater degree of protection against burst errors due to perhaps fading or interference bit interleaving of a block of code words is used. By way of illustration a block of 16 32-bit code words is shown below. The format of each code word corresponds to that of POCSAG code word in which the first bit is used to indicate if the code word comprises an address or a message, bits 2 to 21 comprise address and function bits or message bits, bits 22 to 31 are parity check bits, p, otherwise referred to as the cyclic redundancy check bits CRC, and the bit 32 is selected to give even parity P overall.

| Bit Position | 1 | 2 | 3 | 4 | 5 | ... | 21 | 22 | 23 | 24 | ... | 31 | 32 |
|---|---|---|---|---|---|---|---|---|---|---|---|---|---|
| Word 1 | i | i | i | i | i | ... | i | p | p | p | ... | p | P |
| Word 2 | i | i | i | i | i | ... | i | p | p | p | ... | p | P |
| Word 3 | i | i | i | i | i | ... | i | p | p | p | ... | p | P |
| Word 4 | i | i | i | i | i | ... | i | p | p | p | ... | p | P |
| Word 5 | i | i | i | i | i | ... | i | p | p | p | ... | p | P |
| . | | | | | | | | | | | | | |
| . | | | | | | | | | | | | | |
| Word 12 | i | i | i | i | i | ... | i | p | p | p | ... | p | P |
| Word 13 | i | i | i | i | i | ... | i | p | p | p | ... | p | P |
| Word 14 | i | i | i | i | i | ... | i | p | p | p | ... | p | P |
| Word 15 | i | i | i | i | i | ... | i | p | p | p | ... | p | P |
| Word 16 | i | i | i | i | i | ... | i | p | p | p | ... | p | P |

The known technique for bit interleaving is to read out the bits of the block of code words beginning with bit 1 of code words 1,2 ... 16, followed by bit 2 of code words 1,2 ... 16 and so on with the last bit being bit 32 of word 16. In the case of two bit symbols, the LSB is less well protected and is therefore less dependable. In the event of a message code word comprising only LSBs then it is inherently less dependable than a code word comprising only MSBs.

The communications system in accordance with the present invention compensates for the increased error rate of the LSB of di-bit symbols by transforming the storage of, or the reading out of, the di-bit symbols so that at least some of the LSBs become MSBs and vice versa. In consequence the overall dependability of the code words will be greater than that of code words entirely formed by LSBs but less than that of code words entirely formed by MSBs.

Referring to FIG. 1, the communications system comprises a transmitter Tx, which may be a combination of paging system controller and at least one base station transmitter, and a receiver Rx, which may be a portable paging receiver or a paging receiver section of a larger equipment. The transmitter Tx comprises means 10 for accepting and storing message data to be transmitted. A processing stage 12 is connected to the means 10 for encoding the data, formatting the data into code words including determining the CRC and the even parity bit, and assembling a block or blocks of code words in readiness for interleaving on read-out. The stage 12 also stores one or more transformation algorithms for enabling the interleaved di-bits to be read out in such a manner as to increase their dependability. A M-ary modulator and power amplifying stage 14 is coupled to the processing stage for transmitting the message data by way of an antenna 16.

The receiver Rx comprises an antenna 18 which is coupled to a rf and M-ary demodulating stage 20. The demodulated signals are supplied to a processing stage 22 which stores the received di-bits as blocks of code words and de-transforms the blocks of code words. At the appropriate moment the code words are read-out, decoded, including error corrected, processed, including deformatted, and written into a store 24 in readiness for a user to read.

It will be realised that whatever transformation is applied at the transmitter Tx, the inverse is applied in the receiver Rx but not necessarily by the same algorithm.

The transformations may be relatively simple or more complicated as will be explained below. A simple transformation which is not shown and is usable with any number of code words is to reverse the order in which alternate columns are read out in a manner which is invisible to the transmitting means.

Figure 2:
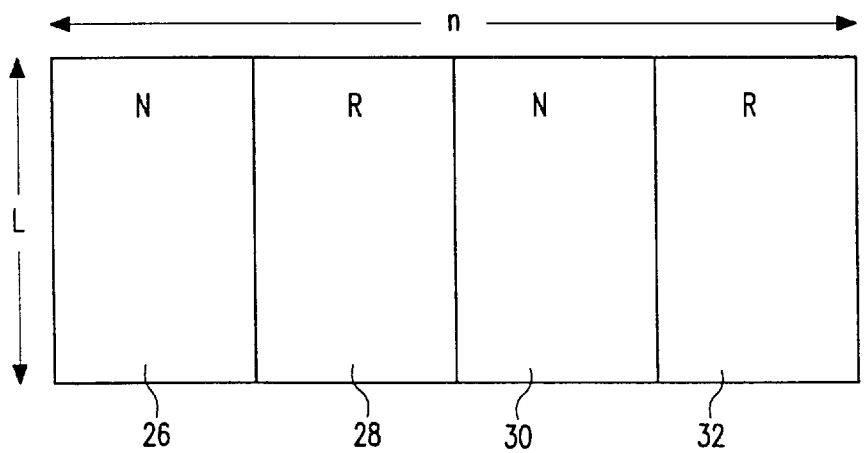

FIG. 2 illustrates a transformation of a block comprising L code words each formed by n bits or symbols. The block of code words is divided into p sections 26,28,30,32 where p=4 in FIG. 2. The di-bits in the first and third sections, 26 and 30, respectively are read normally (N), that is column by column commencing at the top, and the di-bits in the second and fourth sections, 28 and 32 respectively, are read-out reversed vertically (R) so that what would normally have been LSB is an MSB and vice versa. Various ways may be implemented to achieve the reversal including reading each columns from the bottom upwards or by simply taking pairs of code words and forming the di-bits by taking a bit from an even numbered code word and then one from an odd numbered code word in that order. It is not essential for the even and odd code words to be located adjacent to each other in a block.

Figure 3:
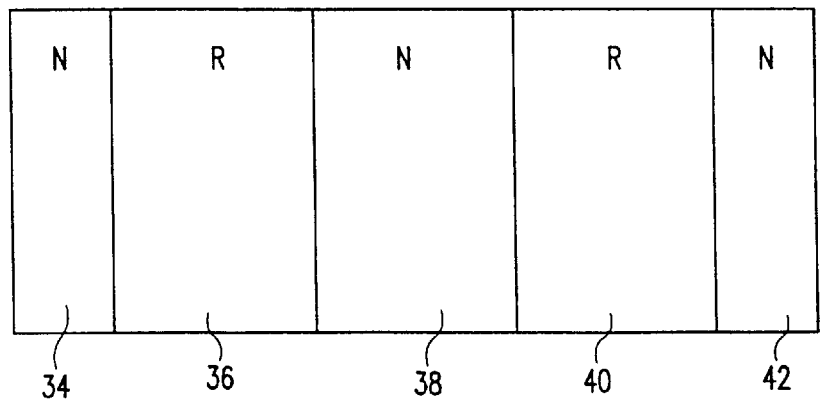

FIG. 3 illustrates a transformation in which p=5 and n=32, the block comprises two smaller, equal sized sections 34,42 which when combined are equal to one of the three larger, equal sized sections 36,38,40. The sections 34,38 and 42 are read-out normally (N) whilst sections 36 and 40 are read-out reversed.

FIG. 4 illustrates another variant in which a block is split into q sub-blocks 44,46,48,50,52 and 54, where q=6. The di-bits of the code words in sub-blocks 44,48 and 52 are read-out normally whilst those in sub-blocks 46,50,54 are read-out reversed.

FIG. 5 illustrates a block which is divided both into sub-blocks and sections that is p=8 and q=6. The elemental areas are formed by a portion (⅛th) of ⅙th of the number of code words. For convenience the elemental areas are marked (N) normal or (R) reverse.

FIG. 6 illustrates an arrangement where the block of code words is divided into sections and alternate sections have the order of the columns of bits in them reversed, so the first column in the section is transformed to the last column in the section and vice versa. For example column X in one section is moved to X' in the same section whereas column Y in the next section is not moved. Additional transformations described may then be applied.

Various transformation schemes can be devised by configuring the software in the processing stage 12 (FIG. 1) and a number of examples are given below.

It will be assumed that interleaved block consists of L codewords each with n bits (symbols), where for example $$L := 8, \; n := 8$$

This block is split into q sub-blocks of L/q codewords and each sub-block is split into p sections of n/p bits (symbols), where for example $$p := 4, \; q := 2$$

Each bit (symbol) is indexed by x and y where:

$$x = 0 \rightarrow (n-1), \; y = 0 \rightarrow (L-1)$$

The point at which each sub-block and section starts within the block can be offset from the start of the block by the x and y offsets:

$$x_{offset} = 0 - n/p, \; y_{offset} = 0 - L/q$$

Each sub-block is indexed by k(y) and each codeword section is indexed by i(x) where:

$$i(x) = \text{round}\left[\frac{(x + x_{offset})}{n} \cdot p\right],$$

$$k(y) = \text{round}\left[\frac{(y + y_{offset})}{L} \cdot q\right]$$

In these expressions for i(x) and k(y), the function in the square brackets will, for convenience, be generically termed Z and round (Z) rounds down to the nearest integer below Z.

Transformation 1 is where alternate sub-blocks of code words have the order of codewords in them reversed:

$$T1(y) = \begin{bmatrix} y & ; k(y) \text{ odd} \\ \frac{L}{q} - 1 - y_{offset} - \text{mod}\left[y, \left(\frac{L}{q} - y_{offset}\right)\right] & ; k(y) < 1 \text{ and } k(y) \text{ even} \\ L - 1 - \text{mod}\left(y + y_{offset}, \frac{L}{q}\right) & ; k(y) \text{ even and } k(y) \geq q \\ \frac{(k(y) + 1) \cdot L}{q} - 1 - y_{offset} - \text{mod}\left(y + y_{offset}, \frac{L}{q}\right) & ; \text{otherwise} \end{bmatrix}$$

Transformation 2 is where alternate sections of all code words have their bits (symbols) reversed in order $$T2(x) = \begin{bmatrix} x & ; i(x) \text{ odd} \\ \frac{n}{p} - 1 - x_{offset} - \text{mod}\left[x, \left(\frac{n}{p} - x_{offset}\right)\right] & ; i(x) < 1 \text{ and } i(x) \text{ even} \\ n - 1 - \text{mod}\left(x + x_{offset}, \frac{n}{p}\right) & ; i(x) \text{ even and } i(x) \geq p \\ \frac{(i(x) + 1) \cdot n}{p} - 1 - x_{offset} - \text{mod}\left(x + x_{offset}, \frac{n}{p}\right) & ; \text{otherwise} \end{bmatrix}$$

Transformation 3 is where alternate sections have the order of the code words in them reversed $$T3(x, y) = \begin{bmatrix} y & ; i(x) \text{ even} \\ \frac{L}{q} - 1 - y_{offset} - \text{mod}\left[y, \left(\frac{L}{q} - y_{offset}\right)\right] & ; k(y) \text{ odd and } k(y) < 1 \\ L - 1 - \text{mod}\left(y + y_{offset}, \frac{L}{q}\right) & ; k(y) \geq q \text{ and } k(y) \text{ odd} \\ \frac{(k(y) + 1) \cdot L}{q} - 1 - y_{offset} - \text{mod}\left(y + y_{offset}, \frac{L}{q}\right) & ; \text{otherwise} \end{bmatrix}$$

$$b_{y,x} := a_{T1(y),x}$$

The following are examples of the 3 transformations, with the last being a combination of all 3.

Source Block:

$$a := \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 61 & 62 & 63 & 64 & 65 & 66 & 67 & 68 \\ 71 & 72 & 73 & 74 & 75 & 76 & 77 & 78 \\ 81 & 82 & 83 & 84 & 85 & 86 & 87 & 88 \end{vmatrix}$$

$$a = \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 61 & 62 & 63 & 64 & 65 & 66 & 67 & 68 \\ 71 & 72 & 73 & 74 & 75 & 76 & 77 & 78 \\ 81 & 82 & 83 & 84 & 85 & 86 & 87 & 88 \end{vmatrix}$$

-continued $$b = \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 81 & 82 & 83 & 84 & 85 & 86 & 87 & 88 \\ 71 & 72 & 73 & 74 & 75 & 76 & 77 & 78 \\ 61 & 62 & 63 & 64 & 65 & 66 & 67 & 68 \end{vmatrix}$$

$c_{y,x} := a_{y,T2(x)}$ $$a = \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 61 & 62 & 63 & 64 & 65 & 66 & 67 & 68 \\ 71 & 72 & 73 & 74 & 75 & 76 & 77 & 78 \\ 81 & 82 & 83 & 84 & 85 & 86 & 87 & 88 \end{vmatrix}$$

$$c = \begin{vmatrix} 11 & 12 & 13 & 15 & 14 & 16 & 17 & 18 \\ 21 & 22 & 23 & 25 & 24 & 26 & 27 & 28 \\ 31 & 32 & 33 & 35 & 34 & 36 & 37 & 38 \\ 41 & 42 & 43 & 45 & 44 & 46 & 47 & 48 \\ 51 & 52 & 53 & 55 & 54 & 56 & 57 & 58 \\ 61 & 62 & 63 & 65 & 64 & 66 & 67 & 68 \\ 71 & 72 & 73 & 75 & 74 & 76 & 77 & 78 \\ 81 & 82 & 83 & 85 & 84 & 86 & 87 & 88 \end{vmatrix}$$

$d_{y,x} := a_{T3(x,y),x}$ $$a = \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 61 & 62 & 63 & 64 & 65 & 66 & 67 & 68 \\ 71 & 72 & 73 & 74 & 75 & 76 & 77 & 78 \\ 81 & 82 & 83 & 84 & 85 & 86 & 87 & 88 \end{vmatrix}$$

$$d = \begin{vmatrix} 11 & 12 & 13 & 14 & 15 & 16 & 17 & 18 \\ 21 & 52 & 53 & 24 & 25 & 56 & 57 & 28 \\ 31 & 42 & 43 & 34 & 35 & 46 & 47 & 38 \\ 41 & 32 & 33 & 44 & 45 & 36 & 37 & 48 \\ 51 & 22 & 23 & 54 & 55 & 26 & 27 & 58 \\ 61 & 82 & 83 & 64 & 65 & 86 & 87 & 68 \\ 71 & 72 & 73 & 74 & 75 & 76 & 77 & 78 \\ 81 & 62 & 63 & 84 & 85 & 66 & 67 & 88 \end{vmatrix}$$

$e_{y,x} := a_{T3(T2(x),T1(y)),T2(x)}$ $$a = \begin{vmatrix} 11 & 12 & 13 & 14 & 15 & 16 & 17 & 18 \\ 21 & 22 & 23 & 24 & 25 & 26 & 27 & 28 \\ 31 & 32 & 33 & 34 & 35 & 36 & 37 & 38 \\ 41 & 42 & 43 & 44 & 45 & 46 & 47 & 48 \\ 51 & 52 & 53 & 54 & 55 & 56 & 57 & 58 \\ 61 & 62 & 63 & 64 & 65 & 66 & 67 & 68 \\ 71 & 72 & 73 & 74 & 75 & 76 & 77 & 78 \\ 81 & 82 & 83 & 84 & 85 & 86 & 87 & 88 \end{vmatrix}$$

-continued $$e = \begin{vmatrix} 11 & 12 & 13 & 15 & 14 & 16 & 17 & 18 \\ 21 & 52 & 53 & 25 & 24 & 56 & 57 & 28 \\ 31 & 42 & 43 & 35 & 34 & 46 & 47 & 38 \\ 41 & 32 & 33 & 45 & 44 & 36 & 37 & 48 \\ 51 & 22 & 23 & 55 & 54 & 26 & 27 & 58 \\ 81 & 62 & 63 & 85 & 84 & 66 & 67 & 88 \\ 71 & 72 & 73 & 75 & 74 & 76 & 77 & 78 \\ 61 & 82 & 83 & 65 & 64 & 86 & 87 & 68 \end{vmatrix}$$

Although in the description of FIGS. 2 to 5 it was assumed that the transformation and bit interleaving took place simultaneously on reading-out of the block of L code words, it is equally possible to apply the transformation to a block of stored code words which are written into a second store in readiness for transmission in which the bit interleaving is transparent to the transmitter.

The present invention can be applied to sub-blocks of an odd number of code words (L/q is odd) in which case the bits of the middle code word of each sub-block remain in the same position, while the bits of all other code words in the sub-block are transformed. In the case of sub-blocks with an even number of code words (L/q is even) all bits of each sub-block which is transformed change position.

As a generality, the foregoing transformations improve the protection for a code m which the number of bits in a symbol, s, and the number of code words in a block, L, have a common factor other than 1. For example if s=6 and L=9 the common factor is 3.

Although the present invention has been described with reference to paging systems, it may be applied to any suitable communication system in which data code words are transmitted using a M-ary, where M=at least 4, modulation scheme.

From reading the present disclosure, other modifications will be apparent to persons skilled in the art. Such modifications may involve other features which are already known in the design, manufacture and use of communication systems and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A communications system comprising:
    a transmitter having means for formatting data bits into code words and for assembling concatenated code words into blocks; storage means for storing at least the data bits of the code words; transformation means for transforming the order of the stored data bits in the code words; wherein the storage means stores the transformed in order data bits; and M-ary modulation and transmission means, where M is at least 4, for modulating and transmitting the stored transformed in order data bits; and
    a receiver having means for receiving and demodulating the transformed in order data bits; and means for restoring the order of the transformed in order data bits and for reading and decoding the restored in order data bits.

2. A communications system comprising:

a transmitter having means for formatting data bits into sequenced code words such that the order of said data bits is sequenced; M-ary modulation means, where M is at least 4, for modulating presented data bits from the code words; transformation means for transforming the order in which the data bits in a given code word are presented to the modulation means; and means for transmitting said transformed in order data bits; and a receiver having means for receiving and demodulating the transformed in order data bits in a transformed data bit sequence; and means for restoring the order of the data bits in the transformed data bit sequence and for reading and decoding the restored in order data bits.

3. A method of communicating data, comprising:

formatting data bits into code words, storing the formatted data bits as a code block in a sequence which is transformed relative to the data bits in a notional block comprising a plurality of rows, each row comprising a code word, and reading-out the data bits from the stored code block, wherein at least some sequentially occurring data bits are stored non-sequentially in a code block which is read-out as stored, and at least some sequentially occurring data bits are stored sequentially in a code block which is read-out non-sequentially;

presenting the transformed data bits to an M-ary modulation means, where M is an integer equal to at least 4, to produce a modulated signal;

transmitting the modulated signal;

receiving the transmitted modulated signal;

demodulating the received signal; and recovering the code words by re-transforming said transformed data bits.

4. A method as claimed in claim 3, further comprising dividing a block of code words into vertical sections, each comprising at least one column, and transforming the order of the bits in at least some of the sections.

5. A method as claimed in claim 3, further comprising dividing a block of code words into sub-blocks of at least two whole code words, and transforming the order of the bits in at least some of the sub-blocks.

6. A method as claimed in claim 3, further comprising partitioning a block into elemental areas by dividing a block of code words into sub-blocks, dividing the sub-blocks into sections, and transforming the order of the bits in at least some of the elemental areas.

7. A method as claimed in claim 3, further comprising assembling an even number of code words into a block, and transforming the order of the bits by reading out alternative columns in opposite directions.

8. A transmitter for use in a communications system, said transmitter comprising: means for formatting data bits into code words and for assembling concatenated code words into blocks; storage means for storing at least the data bits of the code words; transformation means for transforming the order of the stored data bits in the code words; wherein the storage means stores the transformed in order data bits; and M-ary modulation and transmission means, where M is at least 4, for modulating and transmitting the stored transformed in order data bits; and wherein said system comprises a receiver having means for receiving and demodulating the transformed in order data bits; and means for restoring the order of the transformed in order data bits and for reading and decoding the restored in order data bits.

9. A transmitter for use in a communications system, said transmitter comprising: means for formatting data bits into sequenced code words such that the order of said data bits is sequenced; M-ary modulation means, where M is at least 4, for modulating presented data bits from the code words; transformation means for transforming the order in which the data bits in a given code word are presented to the modulation means; and means for transmitting said transformed in order data bits; and wherein said system comprises a receiver having means for receiving and demodulating the transformed in order data bits in a transformed data bit sequence; and means for restoring the order of the data bits in the transformed data bit sequence and for reading and decoding the restored in order data bits.

* * * * *